(12) United States Patent
Takahashi et al.

(10) Patent No.: US 11,557,498 B2
(45) Date of Patent: Jan. 17, 2023

(54) SUBSTRATE PROCESSING METHOD AND SUBSTRATE PROCESSING APPARATUS

(71) Applicant: Tokyo Electron Limited, Tokyo (JP)

(72) Inventors: Toru Takahashi, Miyagi (JP); Hiroshi Tsujimoto, Miyagi (JP); Nobuaki Shindo, Miyagi (JP); Shigeru Yoneda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 187 days.

(21) Appl. No.: 16/830,879

(22) Filed: Mar. 26, 2020

(65) Prior Publication Data
US 2020/0312695 A1    Oct. 1, 2020

(30) Foreign Application Priority Data

Mar. 29, 2019   (JP) .............................. JP2019-066999

(51) Int. Cl.
*H01L 21/683*    (2006.01)
*H01L 21/66*    (2006.01)
(Continued)

(52) U.S. Cl.
CPC .... *H01L 21/6833* (2013.01); *H01J 37/32724* (2013.01); *H01L 22/12* (2013.01);
(Continued)

(58) Field of Classification Search
CPC . H01L 21/6833; H01L 22/12; H01L 21/3065; H01L 21/67109; H01L 21/67248; H01L 21/67253; H01J 37/32724; H01J 2237/2001; H01J 2237/334; B23Q 3/15; C23C 16/4586; H02N 13/00
See application file for complete search history.

(56) References Cited

U.S. PATENT DOCUMENTS

2009/0118872 A1*  5/2009  Nonaka ............... G05D 23/1934
                                                              700/285
2011/0083837 A1*  4/2011  Sasaki ............... H01L 21/67248
                                                              165/104.14
(Continued)

FOREIGN PATENT DOCUMENTS

CN    113707591 A  * 11/2021  ........ H01J 37/32724
JP    2000012664 A    1/2000
(Continued)

*Primary Examiner* — Edward Chin
(74) *Attorney, Agent, or Firm* — Nath, Goldberg & Meyer; Jerald L. Meyer; Tanya E. Harkins

(57) ABSTRACT

A method of processing a substrate includes: a placement step of placing the substrate on an electrostatic chuck set to have a predetermined temperature; a first attraction step of attracting the substrate onto the electrostatic chuck by applying a first direct current (DC) voltage to the electrostatic chuck; a holding step of holding the attraction of the substrate by the electrostatic chuck while applying the first DC voltage to the electrostatic chuck, until a temperature difference between the electrostatic chuck and the substrate becomes 30 degrees C. or less; and a second attraction step of attracting the substrate onto the electrostatic chuck by applying a second DC voltage, which is higher than the first DC voltage, to the electrostatic chuck.

17 Claims, 6 Drawing Sheets

(51) Int. Cl.
*H01J 37/32* (2006.01)
*H01L 21/3065* (2006.01)

(52) U.S. Cl.
CPC . *H01J 2237/2001* (2013.01); *H01J 2237/334* (2013.01); *H01L 21/3065* (2013.01)

(56) References Cited

U.S. PATENT DOCUMENTS

| | | | | |
|---|---|---|---|---|
| 2016/0378092 | A1* | 12/2016 | Yamamoto | H01L 21/6831 700/300 |
| 2019/0393068 | A1* | 12/2019 | Minemura | H01L 21/6833 |
| 2020/0234963 | A1* | 7/2020 | Kumakura | H01L 21/3065 |
| 2020/0286766 | A1* | 9/2020 | Itoyama | H01L 21/6833 |
| 2021/0005495 | A1* | 1/2021 | Sasaki | H02N 13/00 |

FOREIGN PATENT DOCUMENTS

| | | |
|---|---|---|
| JP | 2001-152335 A | 6/2001 |
| JP | 2002-9141 A | 1/2002 |

* cited by examiner

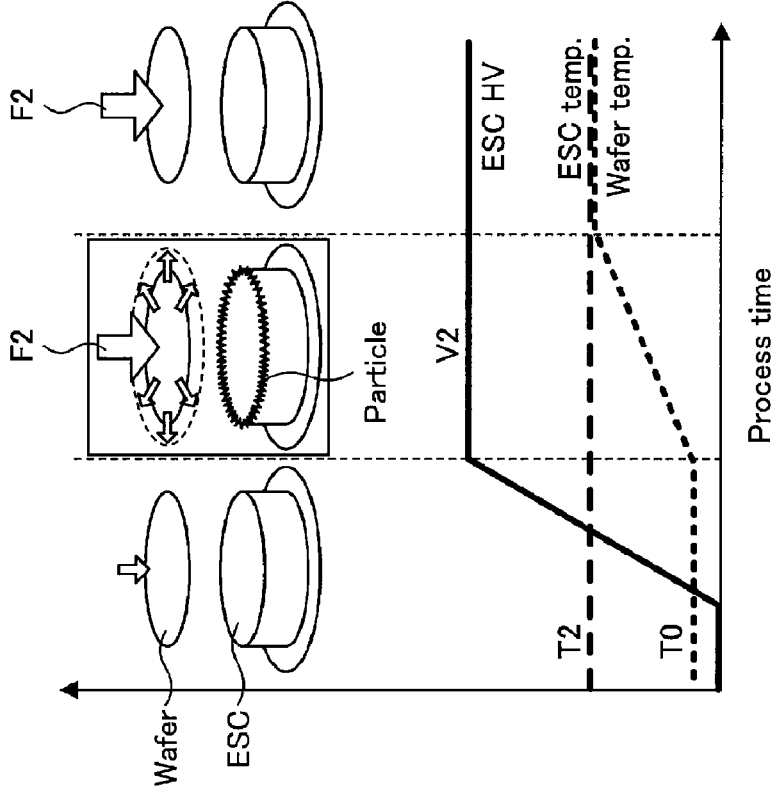
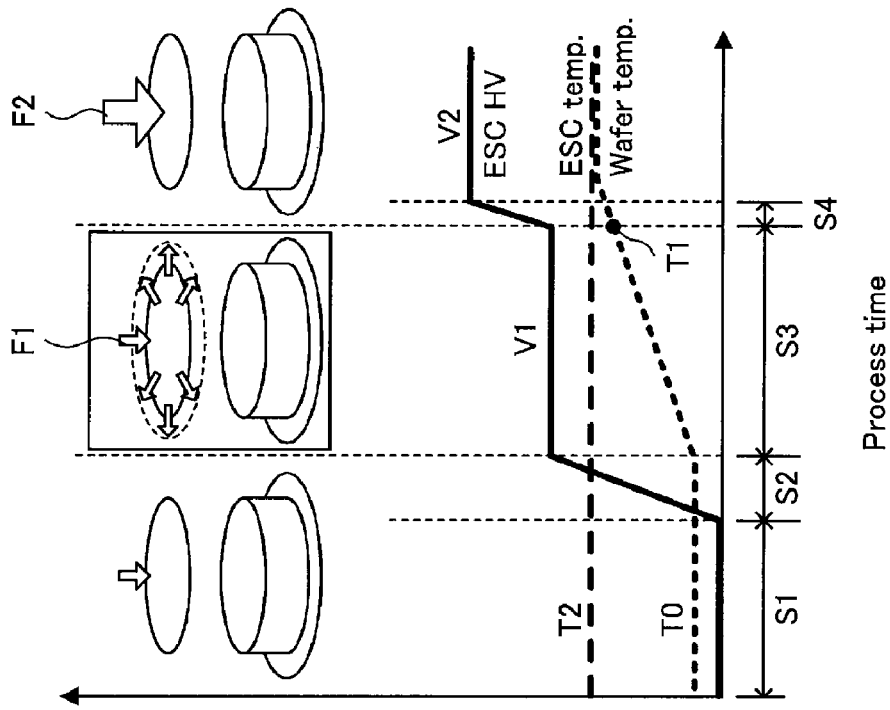

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-066999, filed on Mar. 29, 2019, the entire contents of which are incorporated herein by reference.

TECHNICAL FIELD

The present disclosure relates to a substrate processing method and a substrate processing apparatus.

BACKGROUND

Patent Document 1 discloses a technique of attracting a wafer to an attraction surface of an electrostatic chuck, in which a difference between a temperature of the wafer before attraction and a maximum temperature of the wafer after attraction is set to 50 degrees C. or less. Patent Document 1 also discloses that the wafer is preheated before being attracted to the electrostatic chuck so as to reduce the difference to 50 degrees C. or less.

PRIOR ART DOCUMENT

Patent Document

Patent Document 1: Japanese laid-open publication No. 2000-12664

SUMMARY

An aspect of the present disclosure provides a method of processing a substrate. The method includes: a placement step of placing the substrate on an electrostatic chuck set to have a predetermined temperature; a first attraction step of attracting the substrate onto the electrostatic chuck by applying a first direct current (DC) voltage to the electrostatic chuck; a holding step of holding the attraction of the substrate by the electrostatic chuck while applying the first DC voltage to the electrostatic chuck, until a temperature difference between the electrostatic chuck and the substrate becomes 30 degrees C. or less; and a second attraction step of attracting the substrate onto the electrostatic chuck by applying a second DC voltage, which is higher than the first DC voltage, to the electrostatic chuck.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 1A and 1B are explanatory views illustrating temporal changes in a DC voltage applied to an electrostatic chuck, a temperature of the electrostatic chuck, and a temperature of a wafer.

DETAILED DESCRIPTION

Figure 2:
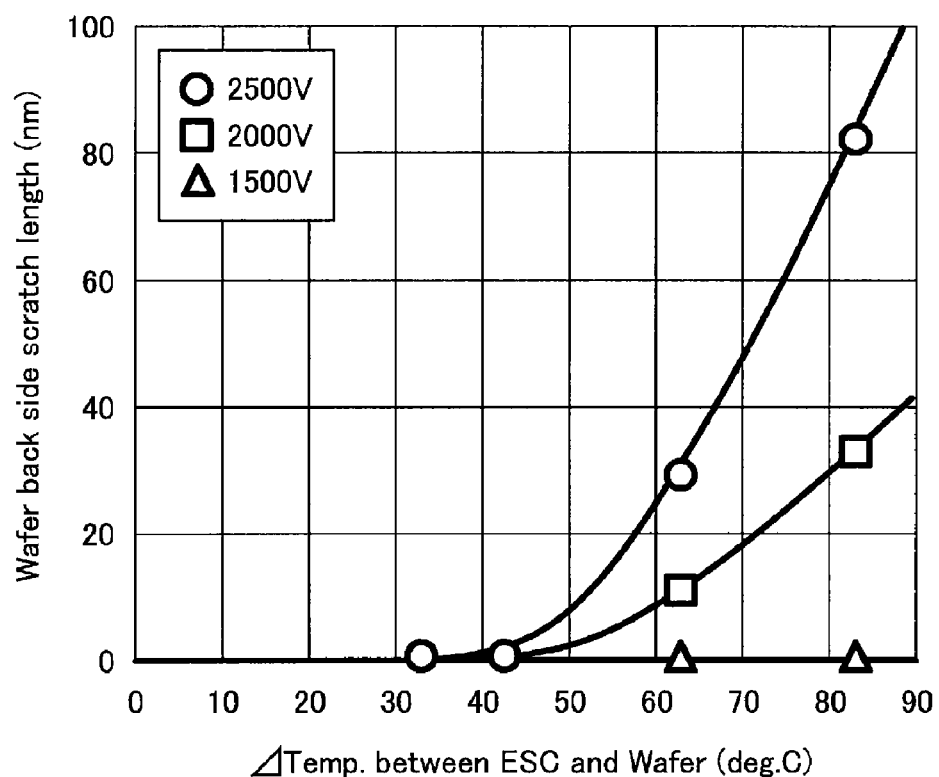
FIG. 2 is an explanatory view illustrating a relationship between a temperature difference between an electrostatic chuck and a wafer and a length of a scratch generated on a back surface of the wafer.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, a plasma processing apparatus generates plasma by exciting a processing gas, and processes a semiconductor wafer (hereinafter, referred to as a "wafer") using the plasma. Such a plasma processing apparatus is provided with an electrostatic chuck (ESC) configured to place a wafer thereon and attract the wafer thereto, and performs a plasma processing in the state in which the wafer is attracted and held onto the electrostatic chuck.

When performing the plasma processing, it is necessary to adjust a temperature of the wafer depending on a target process such as an etching process or a film-forming process. For example, when the plasma processing is performed at a high wafer temperature, it is necessary to heat (increase the temperature of) the wafer. Therefore, in the related art, a temperature of a wafer attracted onto an electrostatic chuck is adjusted by controlling a temperature of the electrostatic chuck. Specifically, a temperature of a wafer is usually adjusted, for example, by placing a wafer of room temperature on an electrostatic chuck, which has been controlled to have a predetermined temperature, such that heat transfer occurs between the wafer and the electrostatic chuck. Then, after the temperature of the wafer reaches a temperature appropriate for a plasma processing, the plasma processing starts.

In the case described above, a thermal expansion difference occurs between the electrostatic chuck and the wafer due to a temperature difference between the electrostatic chuck and the wafer when the wafer is placed on the electrostatic chuck. Then, since the wafer thermally expands in a state of being attracted to the electrostatic chuck, a back surface of the wafer may rub against a front surface of the electrostatic chuck, and the back surface of the wafer may be worn and generate particles.

In this regard, in a method disclosed in Patent Document 1, particles are reduced by setting a difference between a temperature of a wafer before attraction and a maximum temperature of the wafer after attraction to 50 degrees C. or less. However, in the method disclosed in Patent Document 1, the wafer is preheated in order to set the difference to 50 degrees C. or less, and throughput of a wafer processing is reduced by a time period required for the preheating. In particular, when a preheating chamber is provided separately from the plasma processing apparatus, it takes time to perform loading and unloading of the wafer with respect to the preheating chamber, further reducing the throughput.

Alternatively, particles may be reduced by decreasing and increasing a temperature of an electrostatic chuck, instead of preheating the wafer. That is, the wafer is carried into a plasma processing apparatus in a state in which the temperature of the electrostatic chuck is decreased, and after the wafer is placed on the electrostatic chuck, the temperature of the electrostatic chuck is increased. Even in this case, since it takes time for decreasing and increasing the temperature of the electrostatic chuck, throughput of a wafer processing is reduced.

A technique according to the present disclosure reduces particles when a wafer is attracted by an electrostatic chuck in a wafer processing, and improves throughput of the wafer processing. Hereinafter, the present embodiment will be described with reference to the drawings. In the specification and drawings, elements having substantially the same functional configuration will be denoted by the same reference numerals and redundant explanations will be omitted.

<Technique of the Present Disclosure>

First, a technique according to the present disclosure (hereinafter, referred to as "the present technique") will be described with reference to FIGS. 1A and 1B. FIGS. 1A and 1B are explanatory views illustrating temporal changes in a DC voltage applied to an electrostatic chuck ("ESC HV" in FIGS. 1A and 1B), a temperature of the electrostatic chuck ("ESC temp." In FIGS. 1A and 1B), and a temperature of a wafer ("Wafer temp." in FIGS. 1A and 1B). FIGS. 1A and 1B also include schematic explanatory views illustrating states of the wafer ("Wafer" in FIG. 1A) and the electrostatic chuck ("ESC" in FIG. 1A). FIG. 1A illustrates a comparative technique, and FIG. 1B illustrates the present technique.

As described above, it is conceivable to reduce particles by preheating a wafer or by performing a control to decrease and increase a temperature of an electrostatic chuck. However, these methods are not preferable from the viewpoint of wafer processing throughput. Therefore, in the present technique, as represented in FIG. 1B, the temperature of the electrostatic chuck is kept constant at a temperature T2. Specifically, the temperature T2 of the electrostatic chuck is, for example, a target temperature at which the wafer is subjected to a plasma processing. In this case, a temperature T0 of the wafer before being placed on the electrostatic chuck is, for example, room temperature, and is increased to the temperature T2 after being placed on the electrostatic chuck. The present inventors have conceived to reduce particles while keeping the temperature T2 of the electrostatic chuck constant.

Comparatively, as illustrated in FIG. 1A, a voltage V2 is applied to the electrostatic chuck immediately after the wafer is placed on the electrostatic chuck. Specifically, the voltage V2 applied to the electrostatic chuck is a voltage when the electrostatic chuck attracts the wafer when performing a plasma processing. Immediately after being placed on the electrostatic chuck, the wafer is attracted to the electrostatic chuck by an attractive force F2. In this case, when the wafer is placed on the electrostatic chuck, a thermal expansion difference between the electrostatic chuck and the wafer occurs due to a temperature difference (T2−T0) between the temperature T0 of the wafer and the temperature T2 of the electrostatic chuck. At this time, since the wafer is attracted to the electrostatic chuck by the large attractive force F2, the back surface of the wafer and the front surface of the electrostatic chuck are rubbed each other, and particles are generated.

Therefore, the present inventors have conceived to suppress the attractive force until the wafer is heated by the electrostatic chuck and the temperature difference between the electrostatic chuck and the wafer is reduced to some extent. In the present technique, as illustrated in FIG. 1B, the voltage applied to the electrostatic chuck after placing the wafer is increased in two steps.

As illustrated in FIG. 1B, a wafer is placed on an electrostatic chuck (a placement step S1). Subsequently, a first voltage V1 is applied to the electrostatic chuck (a first attraction step S2). Then, the wafer is attracted to the electrostatic chuck by a first attractive force F1. Since the first attractive force F1 is smaller than a second attractive force F2 during the plasma processing, even if a temperature difference occurs between the electrostatic chuck and the wafer, it is possible to suppress the rubbing between the back surface of the wafer and the front surface of the electrostatic chuck. Thus, it is possible to reduce particles.

Subsequently, the voltage applied to the electrostatic chuck is kept at the first voltage V1, and the wafer is kept to be attracted by the electrostatic chuck (a holding step S3). Then, after the temperature of the wafer is increased to a temperature T1, the voltage applied to the electrostatic chuck is increased to a second voltage V2 (a second attraction step S4). At this time, the wafer is attracted to the electrostatic chuck by the second attractive force F2 larger than the first attractive force F1, that is, the second attractive force F2 during the plasma processing. However, since the temperature difference (T2−T1) between the electrostatic chuck and the wafer is sufficiently small, it is possible to suppress the rubbing between the back surface of the wafer and the front surface of the electrostatic chuck. Thus, it is possible to reduce particles.

As described above, according to the present technique, it is possible to reduce particles by increasing the voltage applied to the electrostatic chuck in two steps, and it is possible to improve throughput of a wafer processing by keeping the temperature of the electrostatic chuck constant.

Next, the present inventors performed an experiment in order to investigate a timing for increasing the voltage applied to the electrostatic chuck from the first voltage V1 to the second voltage V2 in the second attraction step S4, that is, the temperature difference (T2−T1) between the electrostatic chuck and the wafer. FIG. 2 illustrates the experimental results. In FIG. 2, the horizontal axis represents the temperature difference between an electrostatic chuck and a wafer when the wafer is placed on the electrostatic chuck, and the vertical axis represents a length of a scratch generated on the back surface of the wafer. In addition, the scratch length indicates a magnitude of the rubbing between the back surface of the wafer and the front surface of the electrostatic chuck, and further indicates an amount of generated particles.

In the experiment illustrated in FIG. 2, the voltage applied to the electrostatic chuck was kept constant, and the length of the scratch generated on the back surface of the wafer was measured while changing the temperature difference between the electrostatic chuck and the wafer. Specifically, the temperature difference was changed to 32 degrees C., 42 degrees C., 62 degrees C., and 82 degrees C. The experiment was performed for three cases in which the voltages applied to the electrostatic chuck were set to be 2500 V, 2000 V, and 1500 V, respectively. In FIG. 2, for each of the voltages, in addition to plots of the measured scratch lengths for the respective temperature differences, a line obtained through regression of a relationship between the scratch length and the temperature difference is also illustrated.

Referring to FIG. 2, when the temperature difference between the electrostatic chuck and the wafer was large, the scratch length was large, whereas when the temperature difference was small, the scratch length was also small. That is, it is possible to reduce particles by reducing the temperature difference. This is because, when the wafer is placed on the electrostatic chuck, the thermal expansion difference generated between the electrostatic chuck and the wafer is reduced, and thus the rubbing between the back surface of the wafer and the front surface of the electrostatic chuck is suppressed. When the temperature difference was 42 degrees C., the scratch length was almost zero regardless of the voltage applied to the electrostatic chuck, but a minute scratch was observed when the voltage applied to the electrostatic chuck was 2500 V. When the temperature difference was 32 degrees C., no scratches were observed regardless of the voltage applied to the electrostatic chuck. Accordingly, in order to reduce particles, the timing at which the voltage applied to the electrostatic chuck is increased from the first voltage V1 to the second voltage V2 illustrated in FIG. 1B may be, in some embodiments, when the temperature difference (T2−T1) between the electrostatic chuck and the wafer is 30 degrees C. or less.

The temperature T2 of the electrostatic chuck is a target temperature at which the wafer is subjected to a plasma processing. Specifically, the temperature T2 may be, for example, 60 degrees C., 80 degrees C., and 120 degrees C. The temperature T0 of the wafer before being placed on the electrostatic chuck is usually room temperature. Thus, in order to set the temperature difference (T2−T1) between the electrostatic chuck and the wafer to be 30 degrees C. or more, the temperature T2 of the electrostatic chuck may be, in some embodiments, 60 degrees C. or more.

Referring to FIG. 2, as the voltage applied to the electrostatic chuck was reduced to 2500 V, 2000 V, and 1500 V, the length of the scratch was also reduced. This is because, as illustrated in FIG. 1B, when the voltage of the electrostatic chuck is reduced, the attractive force of the electrostatic chuck to attract the wafer is reduced, and thus the rubbing between the back surface of the wafer and the front surface of the electrostatic chuck is reduced. When the voltage of the electrostatic chuck was 1500 V, no scratches were observed regardless of the temperature difference between the electrostatic chuck and the wafer. Accordingly, in order to further reduce particles, the first voltage V1 applied to the electrostatic chuck illustrated in FIG. 1B may be, in some embodiments, 1500 V or less.

In addition, the second voltage V2 applied to the electrostatic chuck is a voltage when the electrostatic chuck attracts the wafer during the plasma processing, and is 2500 V or more.

Here, when adjusting the temperature of the wafer attracted onto the electrostatic chuck, a gas for heat transfer (hereinafter, referred to as a "heat transfer gas") such as a He gas or an Ar gas is supplied to a gap between the electrostatic chuck and the wafer (to the back surface of the wafer). By the heat transfer gas, thermal conductivity between the electrostatic chuck and the wafer is improved, and thus it is possible to efficiently adjust the temperature of the wafer.

In the present technique, the voltage applied to the electrostatic chuck is increased in two steps, and the first attractive force F1 when the first voltage V1 is applied in the first attraction step S2 is smaller than the second attractive force F2 when the second voltage V2 is applied in the second attraction step S4. In order to improve the thermal conductivity between the electrostatic chuck and the wafer as described above, the heat transfer gas may be supplied, in some embodiments, at a pressure as high as possible. However, when the pressure of the heat transfer gas is too high, the pressure may exceed the attractive force of the electrostatic chuck to attract the wafer, and thus it is concerned that the attraction of the wafer by the electrostatic chuck cannot be maintained.

Figure 3:
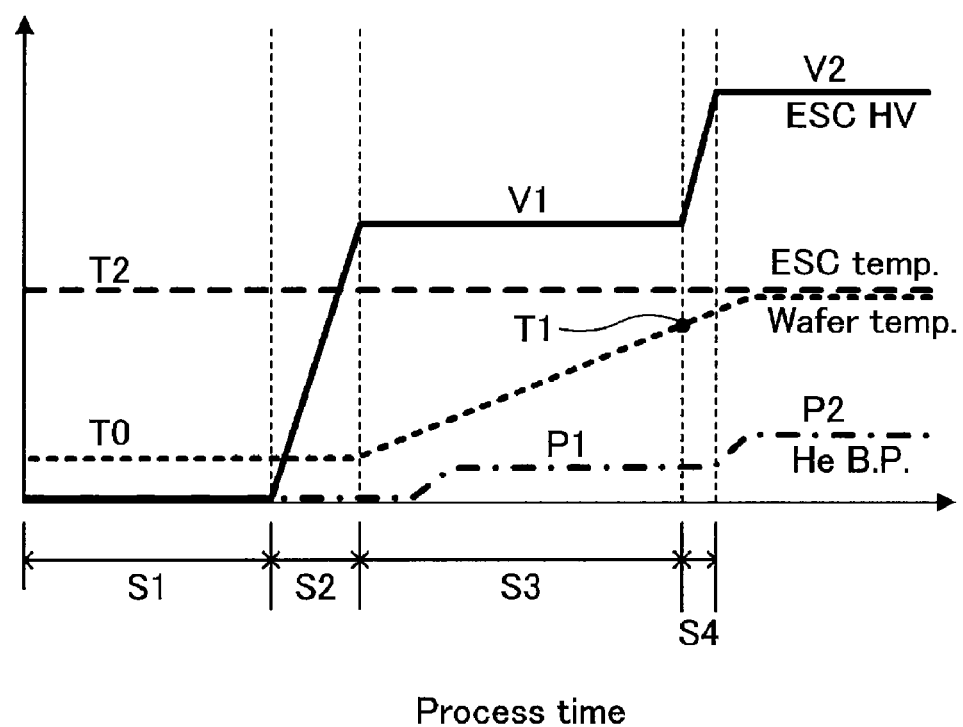
FIG. 3 is an explanatory view illustrating temporal changes in a DC voltage applied to an electrostatic chuck, a temperature of the electrostatic chuck, a temperature of a wafer, and a pressure of a heat transfer gas.

Therefore, in some embodiments, the pressure of the heat transfer gas may be adjusted depending on the voltage applied to the electrostatic chuck, that is, depending on the attractive force of the electrostatic chuck to attract the wafer. In addition to FIG. 1B, FIG. 3 illustrates a temporal change of a pressure of a He gas ("He B.P." in FIG. 3), which is a heat transfer gas. As illustrated in FIG. 3, after the voltage applied to the electrostatic chuck is increased to the first voltage V1 in the first attraction step S2, and while the first voltage V1 is held in the holding step S3, the heat transfer gas is supplied at a first pressure P1 (a first gas supply step). Then, after the voltage applied to the electrostatic chuck is increased to the second voltage V2 in the second attraction step S4, the heat transfer gas is supplied at a second pressure P2 higher than the first pressure P1 (a second pressure gas supply step). In this case, since it is possible to supply the heat transfer gas as much as possible while maintaining the attraction of the wafer by the electrostatic chuck, it is possible to efficiently adjust the temperature of the wafer.

Next, a plasma processing apparatus as a substrate processing apparatus and a plasma processing method as a substrate processing method according to the present embodiment to which the present technique is applied will be described with reference to the drawings.

<Plasma Processing Apparatus>

Figure 4:
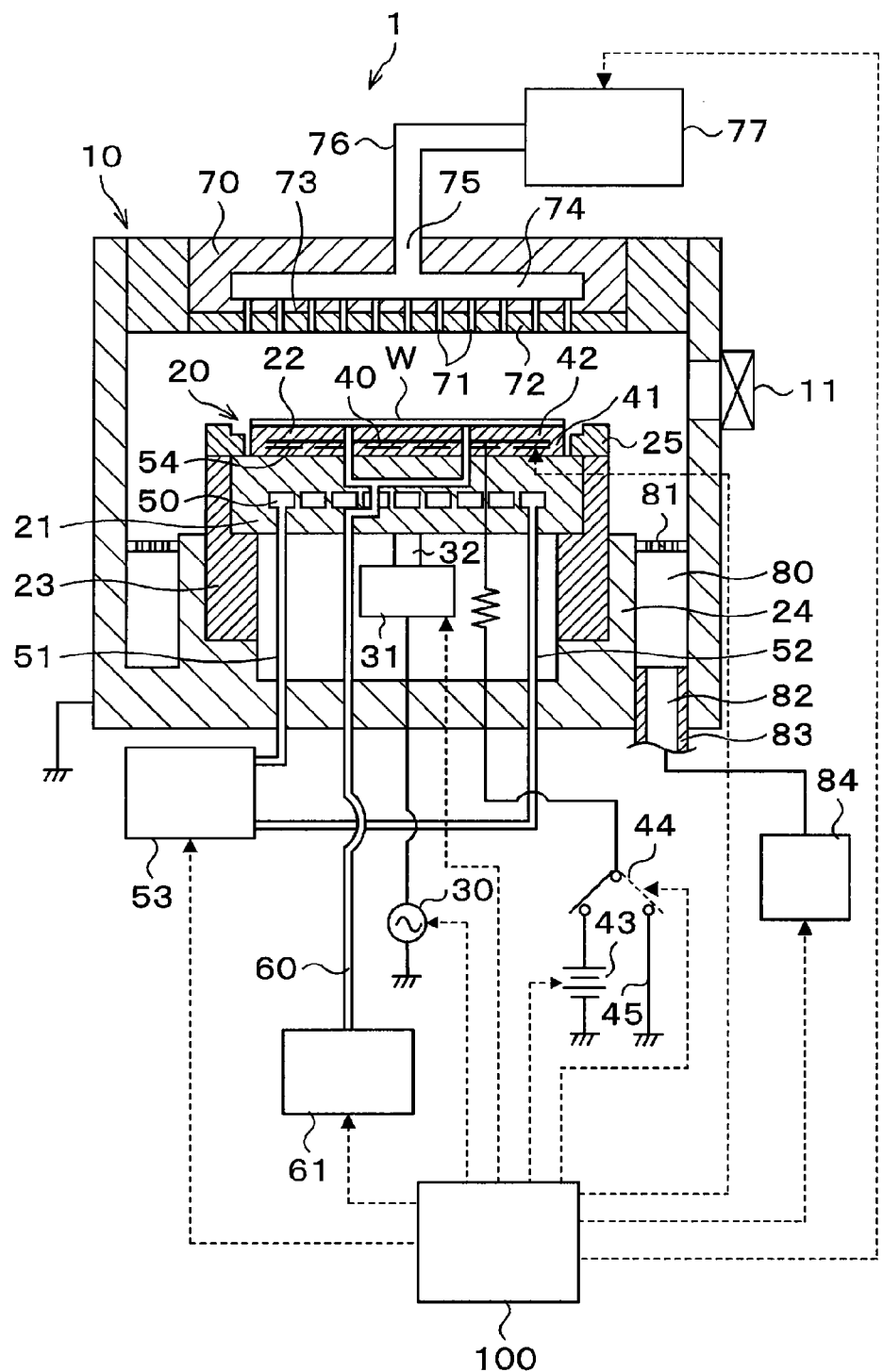
FIG. 4 is a vertical cross-sectional view schematically illustrating an outline of configuration of a plasma processing apparatus according to an embodiment.

Next, configuration of a plasma processing apparatus according to the present embodiment will be described. FIG. 4 is a vertical cross-sectional view schematically illustrating an outline of configuration of a plasma processing apparatus 1. In the present embodiment, the plasma processing apparatus 1 is described by taking a reactive ion etching (RIE) plasma processing apparatus as an example.

The plasma processing apparatus 1 includes a processing container 10 formed of metal such as aluminum or stainless steel, for example. The processing container 10 is electrically grounded. In addition, the processing container 10 has a cylindrical shape, the interior of which is sealable. A gate valve 11, which is opened and closed when a wafer W is loaded or unloaded, is provided on a side wall of the processing container 10.

A stage 20 on which the wafer W as a substrate is placed is provided in the processing container 10. The stage 20 has a stage body 21 and an electrostatic chuck 22. The electrostatic chuck 22 is provided above the stage body 21 and attracts the wafer W. The stage body 21 is supported by a cylindrical support 24 extending vertically upward from the bottom of the processing container 10 via an insulating cylindrical holder 23. A focus ring 25 formed of, for example, quartz, is provided on the top surface of the cylindrical holder 23 so as to annularly surround the outer periphery of the electrostatic chuck 22.

The stage body 21 is formed of a conductive material such as aluminum. A radio frequency power supply 30 configured to supply radio frequency power for plasma generation is electrically connected to the stage body 21 via a matching device 31 and a feeding rod 32. The radio frequency power supply 30 supplies radio frequency power having a predetermined radio frequency, for example, 60 MHz, to the stage 20. Thus, the stage body 21 also functions as a lower electrode. A shower head 70 to be described later functions as an upper electrode. The radio frequency power for plasma generation is capacitively supplied from the radio frequency power supply 30 to a space between the stage body 21 and the shower head 70.

The electrostatic chuck 22 is formed by interposing a sheet-like chuck electrode 40, which is formed of a conductive film, between a pair of dielectric layers 41 and 42 as dielectric members. That is, the electrostatic chuck 22 is a so-called monopolar electrostatic chuck in which only a single pole is formed in a dielectric. A direct current (DC) power supply 43 is connected to the chuck electrode 40 via a switch 44. By applying a DC voltage from the DC power supply 43 to the chuck electrode 40, the electrostatic chuck 22 can attract and hold the wafer W by Coulomb force.

When the application of the voltage to the chuck electrode 40 is stopped, the chuck electrode 40 is in a state of being connected to a ground 45 via the switch 44. Hereinafter, stopping the application of the voltage to the chuck electrode 40 means the state in which the chuck electrode 40 is grounded.

A coolant pipe 50 is provided inside the stage body 21. A coolant having a predetermined temperature, for example, cold water, is circulated and supplied from the chiller unit 53 to the coolant pipe 50 via pipes 51 and 52.

A heater 54 is provided inside the electrostatic chuck 22. A desired alternating current (AC) voltage is applied to the heater 54 from an AC power supply (not illustrated). With this configuration, a processing temperature of the wafer W placed on the electrostatic chuck 22 is adjusted to a desired temperature by cooling by the chiller unit 53 and heating by the heater 54.

As described above, heat from the electrostatic chuck 22 is transferred to the wafer W attracted to the top surface of the electrostatic chuck 22. In this case, in order to efficiently transfer the heat to the wafer W even when the interior of the processing container 10 is depressurized, a heat transfer gas such as a He gas or an Ar gas is supplied from a gas supply line 60 toward the back surface of the wafer W attracted on the top surface of the electrostatic chuck 22. The gas supply line 60 is connected to a heat transfer gas source 61.

The shower head 70 as an upper electrode having a ground potential is provided on the ceiling portion of the processing container 10. Radio frequency power is supplied to the space between the stage 20 and the shower head 70 by the radio frequency power supply 30 described above. The shower head 70 has an electrode plate 72 having a plurality of gas vent holes 71 and an electrode support 73 that detachably supports the electrode plate 72. A buffer chamber 74 is provided inside the electrode support 73. A processing gas source 77 is connected to a gas inlet 75 of the buffer chamber 74 via a gas supply pipe 76. With this configuration, a desired processing gas is supplied from the shower head 70 into the processing container 10.

An exhaust path 80 is formed between the inner wall of the processing container 10 and the outer wall of the cylindrical support 24. An annular baffle plate 81 is installed in the exhaust path 80. An exhaust port 82 is provided at a bottom portion of the exhaust path 80, and the exhaust port 82 is connected to an exhaust device 84 via an exhaust pipe 83. The exhaust device 84 has a vacuum pump (not illustrate), and depressurizes the interior the processing container 10 to a predetermined degree of vacuum.

The plasma processing apparatus 1 described above is provided with a control device 100. The control device 100 controls respective components provided in the plasma processing apparatus 1, for example, the processing gas source 77, the exhaust device 84, the heater 54, the DC power supply 43, the switch 44, the matching device 31, the radio frequency power supply 30, the heat transfer gas source 61, and the chiller unit 53.

The control device 100 is, for example, a computer, and has a program storage (not illustrated). In the program storage, a program for controlling processes on the wafer W in the plasma processing apparatus 1 is stored. In the program storage, a control program for controlling various kinds of processes by a processor and a program for causing the respective components of the plasma processing apparatus 1 to execute the processes according to a processing condition, that is, a processing recipe, are also stored. The programs described above may be recorded in a computer-readable storage medium, and may be installed in the control device 100 from the storage medium.

<Plasma Processing Method>

Next, a plasma processing performed using the plasma processing apparatus 1 configured as described above will be described. In the present embodiment, for example, a dry etching process is performed as the plasma processing.

Figure 5:
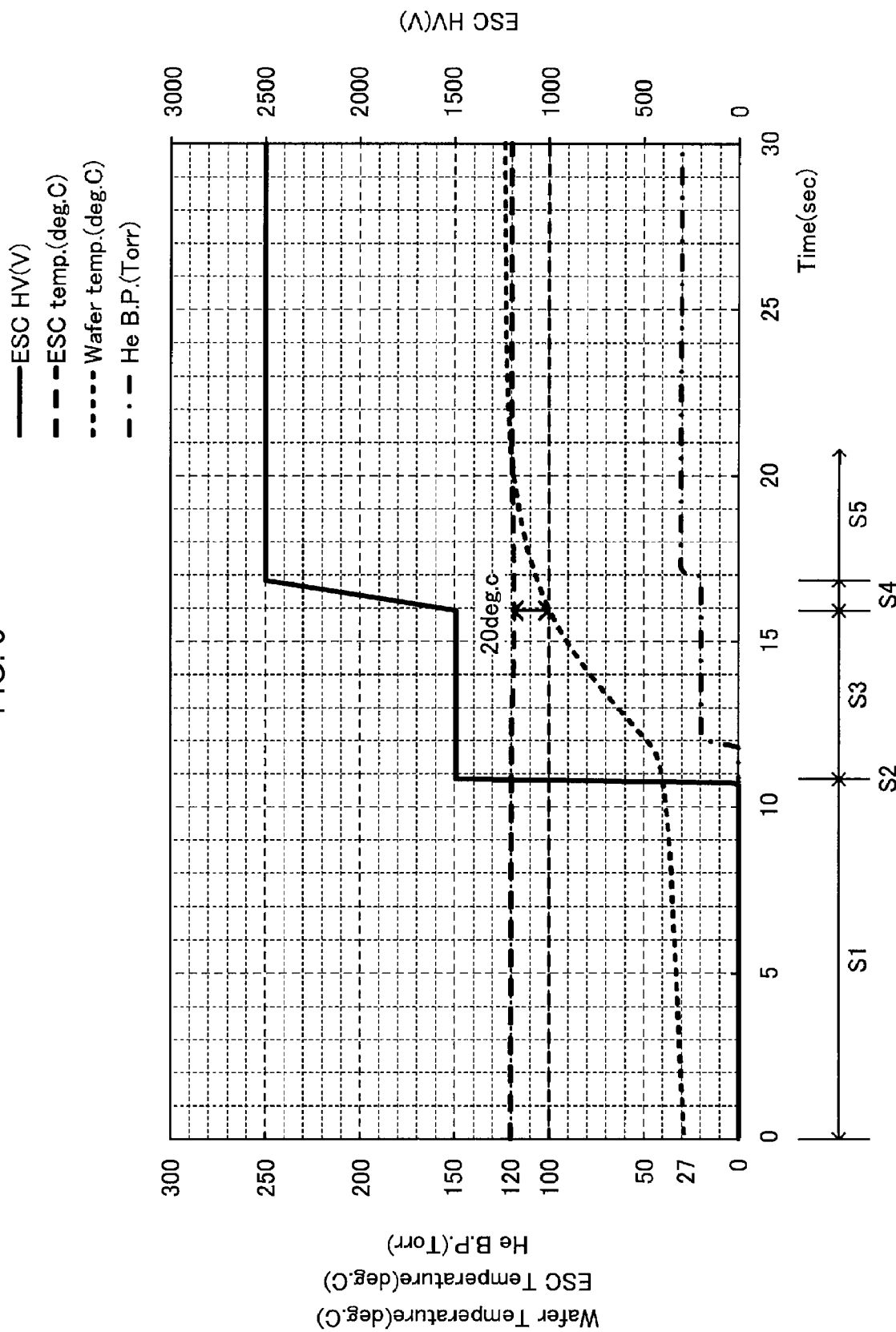
FIG. 5 is an explanatory view illustrating processing steps in a plasma processing according to an embodiment.

FIG. 5 is an explanatory view illustrating processing steps in a plasma processing. FIG. 5 illustrates temporal changes in a DC voltage ("ESC HV" in FIG. 5) applied to the electrostatic chuck 22, a temperature of the electrostatic chuck 22 ("ESC temp." in FIG. 5), a temperature of the wafer W ("Wafer temp." in FIG. 5), and a pressure of a He gas (heat transfer gas) ("He B.P." in FIG. 5). The values of time, voltage, temperature, and pressure illustrated in FIG. 5 are examples only, and may vary depending on a recipe of the plasma processing.

First, the gate valve 11 is opened, and the wafer W is loaded into the processing container 10 and placed on the electrostatic chuck 22 (the placement step S1). At this time, the electrostatic chuck 22 is kept at a predetermined temperature, for example, 120 degrees C. The temperature of the wafer W when the wafer W is placed on the electrostatic chuck 22 is room temperature, for example, 27 degrees C. Since the wafer W placed on the electrostatic chuck 22 is not yet attracted, the temperature of the wafer W is not significantly increased.

After the wafer W is loaded, the gate valve 11 is closed. Then, the interior of the processing container 10 is depressurized to a predetermined degree of vacuum by the exhaust device 84.

Subsequently, an Ar gas is supplied from the processing gas source 77 into the processing container 10 via the shower head 70, and the pressure in the processing container 10 is adjusted. Then, radio frequency power is supplied to the space between the stage 20 and the shower head 70 by the radio frequency power supply 30 and plasma is generated. Subsequently, a first voltage, for example, 1500 V, is applied to the chuck electrode 40 of the electrostatic chuck 22 from the DC power supply 43 so as to attract the wafer W onto the electrostatic chuck 22 (the first attraction step S2). Then, the wafer W is attracted to the electrostatic chuck 22 by a first attractive force. Since the first attractive force is smaller than a second attractive force applied during the plasma processing, even when a temperature difference occurs between the electrostatic chuck 22 and the wafer W, it is possible to reduce the rubbing between the back surface of the wafer W and the front surface of the electrostatic chuck 22. Thus, it is possible to reduce particles.

Subsequently, while the first voltage (1500 V) is applied to the electrostatic chuck 22, the attraction of the wafer W by the electrostatic chuck 22 is held (the holding step S3).

In the holding step S3 as well, since the attractive force of the electrostatic chuck 22 to attract the wafer W is sufficiently small, it is possible to suppress the rubbing between the back surface of the wafer W and the front surface of the electrostatic chuck 22.

In the holding step S3, a He gas is supplied from the heat transfer gas source 61 to the space between the electrostatic chuck 22 and the wafer W at a first pressure, for example, 20 Torr (the first gas supply step). In some embodiments, the first pressure may be set to be high within a range in which the wafer W is not separated from the electrostatic chuck 22 due to the pressure of the heat transfer gas. In this case, even when the first attractive force for the wafer W is small, the wafer W is not separated from the electrostatic chuck 22 and the He gas is supplied as much as possible. Thus, it is possible to efficiently adjust the temperature of the wafer W. For this reason, it is possible to shorten a holding time of the holding step S3, and thus it is possible to improve throughput of the wafer processing. Further, since the pressure of the heat transfer gas applies a force in a direction in which the wafer W is separated from the electrostatic chuck 22, it is possible to further suppress the rubbing between the back surface of the wafer W and the front surface of the electrostatic chuck 22.

When the temperature of the wafer W is increased to, for example, 100 degrees C. and the temperature difference between the electrostatic chuck 22 and the wafer W becomes 20 degrees C., the voltage applied to the electrostatic chuck 22 is increased to a second voltage, for example, 2500 V (the second attraction step S4). At this time, the wafer W is attracted to the electrostatic chuck 22 with a second attractive force larger than the first attractive force, that is, the second attractive force applied during the plasma processing. However, since the temperature difference between the electrostatic chuck 22 and the wafer W is sufficiently small as 20 degrees C., it is possible to suppress the rubbing between the back surface of the wafer W and the front surface of the electrostatic chuck 22, and thus it is possible to reduce particles. In addition, although the temperature difference between the electrostatic chuck 22 and the wafer W may be 30 degrees C. or less as described with reference to FIG. 2, in the present embodiment, the temperature difference is set to be 20 degrees C. for a margin.

When the voltage applied to the electrostatic chuck 22 is increased to the second voltage (2500 V), the pressure of the He gas supplied to the space between the electrostatic chuck 22 and the wafer W is increased from the first pressure to a second pressure, for example, 30 Torr, which is higher than the first pressure (the second gas supply step). Since the wafer W is attracted by the second attractive force larger than the first attractive force in the holding step S3, even when the heat transfer gas is supplied at the second pressure higher than the first pressure, the wafer W can be held by the electrostatic chuck 22. By supplying the He gas at the pressure higher than that in the holding step S3, it is possible to more efficiently adjust the temperature of the wafer W. For this reason, it is possible to shorten a time period required to increase the temperature of the wafer W to the target temperature during the plasma processing, for example, 120 degrees C., and thus it is possible to further improve throughput of the wafer processing.

When the voltage applied to the electrostatic chuck 22 becomes the second voltage and the wafer W is attracted to the electrostatic chuck 22 by the second attractive force, the supply of radio frequency power is stopped. Subsequently, the plasma processing is performed (the processing step S5). Specifically, a processing gas (an etching gas) is supplied from the processing gas source 77 at a predetermined flow rate to a region above the wafer W in the processing container 10. At this time, the interior of the processing container 10 is maintained at a predetermined degree of vacuum by the exhaust device 84. In addition, a predetermined level of radio frequency power is supplied from the radio frequency power supply 30 to the stage body 21. Then, the processing gas introduced in a form of a shower from the shower head 70 is converted into plasma by the radio frequency power from the radio frequency power supply 30, whereby plasma is generated in a plasma generation space between the upper electrode (shower head 70) and the lower electrode (the stage body 21). Then, the main surface of the wafer W is etched by radicals and ions in the generated plasma.

When terminating the plasma etching process, first, the supply of the radio frequency power from the radio frequency power supply 30 and the supply of the processing gas from the processing gas source 77 are stopped. Subsequently, the supply of the He gas to the back surface of the wafer W is stopped, and the attraction and holding by the electrostatic chuck 22 is also stopped. When the attraction and holding by the electrostatic chuck 22 is stopped, electricity may be removed by applying a negative voltage. Thereafter, the depressurization by the exhaust device 84 is stopped.

Then, the gate valve 11 is opened, and the wafer W is unloaded from the processing container 10. Thus, a series of plasma processing on the wafer W is terminated.

According to the embodiment described above, since the voltage applied to the electrostatic chuck 22 after the placement of the wafer W is increased in two steps, it is possible to suppress the rubbing between the back surface of the wafer W and the front surface of the electrostatic chuck 22. Thus, it is possible to reduce particles. The present inventors actually performed a plasma processing on wafers W according to the present embodiment, and then imaged and observed the surfaces of the wafers W. As a result, there exist almost no particles adhered to the surfaces of the wafers W.

In addition, according to the present embodiment, since the temperature of the electrostatic chuck 22 is kept constant, it is possible to improve throughput of the wafer processing compared to the case where a wafer W is preheated or the temperature of the electrostatic chuck 22 is controlled to be decreased and increased as in the prior art. According to a result of investigation actually performed by the present inventors, when the temperature of the electrostatic chuck 22 was kept constant as in the present embodiment, it was possible to reduce the time period required to increase the temperature of the wafer W to a predetermined temperature to about half, compared with the case where the temperature of the electrostatic chuck 22 was controlled to be decreased and increased.

In addition, according to the present embodiment, since the pressure of the He gas is adjusted in two steps depending on the voltage (the first voltage and the second voltage) applied to the electrostatic chuck 22, it is possible to supply the He gas as much as possible while maintaining the attraction of the wafer W by the electrostatic chuck 22. As a result, it is possible to efficiently adjust the temperature of the wafer W, and thus it is possible to further improve throughput of the wafer processing.

<Setting Holding Time of Holding Step>

In the embodiment described above, the timing at which the voltage applied to the electrostatic chuck 22 is increased from the first voltage to the second voltage is when the temperature difference between the electrostatic chuck 22 and the wafer W becomes 20 degrees C. This timing may be set by measuring the temperature of the wafer W, or may be automatically set by the control device 100. That is, the control device 100 may automatically set a holding time of the holding step S3.

Figure 6:
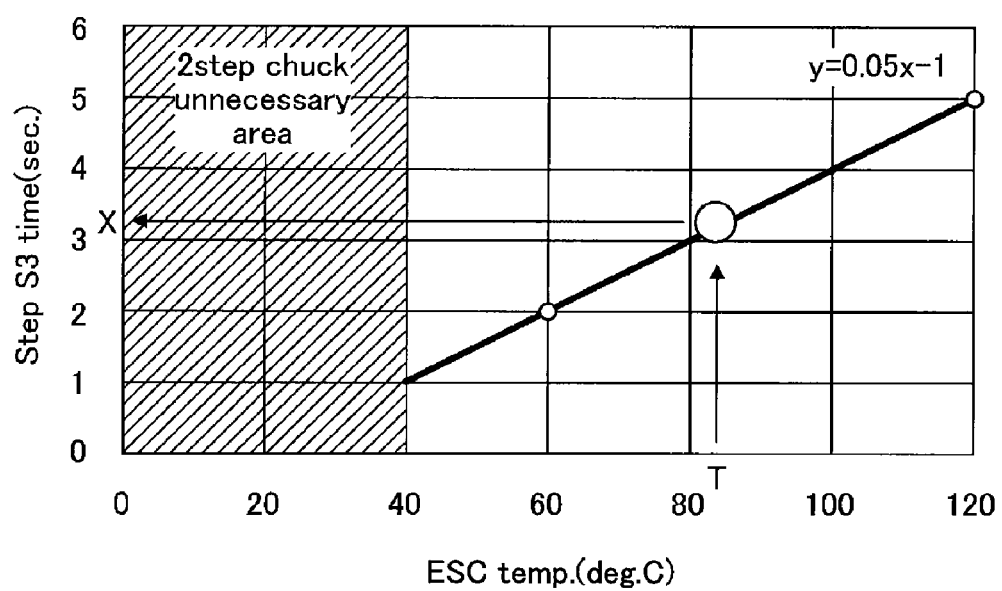
FIG. 6 is an explanatory view illustrating a correlation between a temperature of an electrostatic chuck and a holding time.

First, a correlation between the temperature of the electrostatic chuck 22 and the holding time of the holding step S3 is derived. FIG. 6 illustrates an example of this correlation. In FIG. 6, the horizontal axis of represents the temperature of the electrostatic chuck 22, and the vertical axis represents the holding time of the holding step S3.

In deriving the correlation, holding times of the holding step S3 when the temperature of the electrostatic chuck 22 was set to 60 degrees C. and 120 degrees C., respectively, were measured. Specifically, a wafer W of room temperature, for example, 27 degrees C., was placed on the electrostatic chuck 22 maintained at 60 degrees C. Then, the first voltage of 1500 V was applied to the electrostatic chuck 22, and a time period required for the temperature difference between the electrostatic chuck 22 and the wafer W to reach 20 degrees C. was measured as two seconds. This time period of two seconds is the holding time for the holding step S3. Similarly, the holding time of the holding step S3 was measured for the electrostatic chuck 22 maintained at 120 degrees C., and the result was five seconds.

In FIG. 6, the holding times of the holding step S3 with respect to the temperatures of 60 degrees C. and 120 degrees C. of the electrostatic chuck 22, that is, two seconds and five seconds were plotted and linearly regressed to derive a correlation (a correlation line). Since the voltage applied to the electrostatic chuck 22 is kept constant and a heat transfer rate from the electrostatic chuck 22 to the wafer W is kept constant, a temperature-increasing rate of the wafer W is also kept constant. Therefore, in deriving the correlation, two measurement points were linearly regressed as described above.

In FIG. 6, the hatched portion is a region where it is not necessary to increase the voltage applied to the electrostatic chuck 22 in two steps as in the present embodiment. Specifically, it is a region where the temperature of the electrostatic chuck 22 is 30 degrees C. or less.

As described above, when the correlation between the temperature of the electrostatic chuck 22 and the holding time of the holding step S3 is derived, the control device 100 may automatically set the holding time of the holding step S3 depending on the temperature of the electrostatic chuck 22. Specifically, for example, when an operator inputs the temperature T of the electrostatic chuck 22, the control device 100 may automatically calculate the holding time X of the holding step S3 and create a processing recipe.

In such a case, the two-step attraction of the wafer W by the electrostatic chuck 22 according to the present embodiment can be implemented by simply setting the holding time of the holding step S3 without performing a complicated control. In addition, by automatically generating recipes other than that for the holding step S3 as well, it is also possible to automatically generate a recipe for the entirety of the wafer processing.

The correlation illustrated in FIG. 6 is an example only, and the correlation may vary depending on the first voltage applied to the electrostatic chuck 22 or the like. The correlation may be derived in accordance with a required process.

In the correlation illustrated in FIG. 6, the holding time of the holding step S3 was measured by performing an experiment, but the holding time of the holding step S3 may be estimated by performing a simulation.

It should be understood that the embodiment disclosed herein is illustrative and is not limiting in all aspects. The above-described embodiment may be omitted, replaced, or modified in various forms without departing from the scope and spirit of the appended claims.

For example, although the case in which the wafer W is heated (temperature-increasing) on the electrostatic chuck 22 has been described in the above embodiment, the present technique is also useful when a wafer W is cooled (temperature-decreasing) on the electrostatic chuck 22. That is, even when the wafer W is cooled on the electrostatic chuck 22, the voltage applied to the electrostatic chuck 22 may be increased in two steps such that the wafer W is attracted in two steps by the electrostatic chuck 22.

Even when cooling a wafer W, a thermal expansion difference occurs between the electrostatic chuck and the wafer due to a temperature difference between the electrostatic chuck and the wafer. Then, similarly to the case in which a wafer is heated, a problem may occur in that the back surface of the wafer and the front surface of the electrostatic chuck are rubbed each other, and the back surface of the wafer is worn to generate particles. Therefore, even in the case of cooling the wafer, it is possible to reduce particles by applying the present technique.

In addition, in the present embodiment, the voltage is applied in two steps of the first voltage and the second voltage, but the voltage may be applied in three or more steps. For example, when the first voltage (or the second voltage) is applied, the voltage may be applied stepwise. In addition, after performing the second attraction step, a third attraction step using a third voltage higher than the second voltage, a second holding step, and a fourth attraction step using a fourth voltage higher than the third voltage may be performed. In this case, after the third attraction step, a third gas supply step at a third pressure higher than the second pressure may be performed, and after the fourth attraction step, a fourth gas supply step at a fourth pressure higher than the third pressure may be performed. In addition, when it is necessary to set the temperature of the electrostatic chuck 22 (the temperature during the plasma processing) to be high, the temperature of the electrostatic chuck 22 may be increased between the second attraction step and the third attraction step.

In addition, the above-described plasma processing apparatus 1 has been described by taking an RIE plasma processing apparatus as an example, but the present embodiment may be applied to any type of plasma processing apparatus.

The following configurations also belong to the technical scope of the present disclosure.

(1) A method of processing a substrate, the method including: a placement step of placing the substrate on an electrostatic chuck set to have a predetermined temperature; a first attraction step of attracting the substrate onto the electrostatic chuck by applying a first direct current (DC) voltage to the electrostatic chuck; a holding step of holding the attraction of the substrate by the electrostatic chuck while applying the first DC voltage to the electrostatic chuck, until a temperature difference between the electrostatic chuck and the substrate becomes 30 degrees C. or less; and a second attraction step of attracting the substrate onto the electrostatic chuck by applying a second DC voltage, which is higher than the first DC voltage, to the electrostatic chuck.

According to the above (1), since the voltage applied to the electrostatic chuck after the substrate is placed on the electrostatic chuck is increased in two steps so as to attract the substrate, it is possible to suppress the rubbing between the back surface of the substrate and the front surface of the electrostatic chuck. Thus, it is possible to reduce particles. In addition, according to the above (1), since the temperature of the electrostatic chuck is maintained at a predetermined temperature, it is possible to improve throughput of the substrate processing.

(2) The substrate processing method of (1), further including a first gas supply step of supplying a heat transfer gas to a back surface of the substrate at a first pressure, the first gas supply step being performed between the first attraction step and the holding step.

(3) The substrate processing method of (2), further including a second gas supply step of supplying a heat transfer gas to the back surface of the substrate at a second pressure which is higher than the first pressure, the second gas supply step being performed after the second attraction step.

According to the above (2) and (3), since the pressure of the heat transfer gas is adjusted depending on the voltage applied to the electrostatic chuck, it is possible to supply the heat transfer gas as much as possible while appropriately maintaining the attraction of the substrate by the electrostatic chuck. As a result, it is possible to efficiently adjust the temperature of the substrate, and it is possible to further improve throughput of the wafer processing.

(4) The substrate processing method of any of (1) to (3), wherein the first DC voltage is a voltage of 1500 V or less.

(5) The substrate processing method of any of (1) to (4), wherein the second DC voltage is a voltage of 2500 V or more.

(6) The substrate processing method of any of (1) to (5), wherein the predetermined temperature is a target temperature for processing the substrate.

(7) The substrate processing method of (6), wherein the predetermined temperature is 60 degrees C. or more.

(8) The substrate processing method of any of (1) to (7), further including a processing step of performing a plasma processing on the substrate by supplying a processing gas to a region above the substrate and generating plasma by the processing gas, the processing step being performed after the second attraction step.

According to the above (8), since the processing step is performed in a state in which the substrate is appropriately attracted onto the electrostatic chuck in the second attraction step, it is possible to appropriately perform the plasma processing on the substrate.

(9) The substrate processing method of any of (1) to (8), further including a setting step of setting a holding time of the holding step, the setting step being performed before the placement step, wherein the setting step includes setting, based on a pre-derived correlation between a temperature of the electrostatic chuck and the holding time of the holding step, the holding time of the holding step from a temperature of the electrostatic chuck when processing the substrate.

(10) A substrate processing apparatus for processing a substrate including: an electrostatic chuck configured to place the substrate on the electrostatic chuck; and a controller configured to control the electrostatic chuck, wherein the controller controls the electrostatic chuck to execute: a placement step of placing the substrate on the electrostatic chuck set to have a predetermined temperature; a first attraction step of attracting the substrate onto the electrostatic chuck by applying a first direct current (DC) voltage to the electrostatic chuck; a holding step of holding the attraction of the substrate by the electrostatic chuck while applying the first DC voltage to the electrostatic chuck, until a temperature difference between the electrostatic chuck and the substrate becomes 30 degrees C. or less; and a second attraction step of attracting the substrate onto the electrostatic chuck by applying a second DC voltage, which is higher than the first DC voltage, to the electrostatic chuck.

(11) The substrate processing apparatus of (10), wherein the controller is further configured to: derive in advance a correlation between a temperature of the electrostatic chuck and a holding time of the holding step; and set, based on the correlation, the holding time of the holding step from a temperature of the electrostatic chuck when processing the substrate.

According to (11), since the controller can automatically set the holding time of the holding step based on the correlation, it is possible to perform two step attraction of the substrate by the electrostatic chuck (the first attraction step and the second attraction step) without performing a complicated control.

According to the present disclosure, it is possible to reduce particles when attracting a substrate using an electrostatic chuck in a substrate processing, and to improve throughput of the substrate processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, the method comprising:
   (a) placing the substrate on an electrostatic chuck set to have a predetermined temperature;
   (b) attracting the substrate onto the electrostatic chuck by applying a first direct current (DC) voltage to the electrostatic chuck;
   (c) holding the attraction of the substrate by the electrostatic chuck while applying the first DC voltage to the electrostatic chuck, until a temperature difference between the electrostatic chuck and the substrate becomes 30 degrees C. or less; and
   (d) attracting the substrate onto the electrostatic chuck by applying a second DC voltage, which is higher than the first DC voltage, to the electrostatic chuck,
   wherein the steps (a) to (d) are performed sequentially.

2. The method of claim 1, further comprising:
   (e) supplying a heat transfer gas to a back surface of the substrate at a first pressure between the step (b) and the step (c).

3. The method of claim 2, further comprising:
   (f) supplying the heat transfer gas to the back surface of the substrate at a second pressure which is higher than the first pressure after the step (e).

4. The method of claim 3, wherein the first DC voltage is a voltage of 1500 V or less.

5. The method of claim 4, wherein the second DC voltage is a voltage of 2500 V or more.

6. The method of claim 5, further comprising:
   (g) performing a plasma processing on the substrate by supplying a processing gas to a region above the substrate and generating plasma by the processing gas after the step (d).

7. The method of claim 6, further comprising:
(h) before the step (a), setting a holding time of the step (c), based on a pre-derived correlation between a temperature of the electrostatic chuck and the holding time, from a target temperature of the electrostatic chuck of the step (g).

8. The method of claim 7, wherein the predetermined temperature is the target temperature of the step (g).

9. The method of claim 8, wherein the predetermined temperature is 60 degrees C. or more.

10. The method of claim 1, wherein the first DC voltage is a voltage of 1500 V or less.

11. The method of claim 1, wherein the second DC voltage is a voltage of 2500 V or more.

12. The method of claim 1, further comprising:
(g) performing a plasma processing on the substrate by supplying a processing gas to a region above the substrate and generating plasma by the processing gas after the step (d).

13. The method of claim 12, further comprising:
(h) before the step (a), setting a holding time of the step (c), based on a pre-derived correlation between a temperature of the electrostatic chuck and the holding time, from a target temperature of the electrostatic chuck of the step (g).

14. The method of claim 12, wherein the predetermined temperature is a target temperature of the electrostatic chuck of the step (g).

15. The method of claim 14, wherein the predetermined temperature is 60 degrees C. or more.

16. A substrate processing apparatus for processing a substrate, the apparatus comprising:
an electrostatic chuck configured to place the substrate on the electrostatic chuck; and
a controller configured to control the electrostatic chuck, wherein the controller controls the electrostatic chuck to execute:
  (a) a placement step of placing the substrate on the electrostatic chuck set to have a predetermined temperature;
  (b) a first attraction step of attracting the substrate onto the electrostatic chuck by applying a first direct current (DC) voltage to the electrostatic chuck;
  (c) a holding step of holding the attraction of the substrate by the electrostatic chuck while applying the first DC voltage to the electrostatic chuck, until a temperature difference between the electrostatic chuck and the substrate becomes 30 degrees C. or less; and
  (d) a second attraction step of attracting the substrate onto the electrostatic chuck by applying a second DC voltage, which is higher than the first DC voltage, to the electrostatic chuck,
wherein the steps (a) to (d) are performed sequentially.

17. The substrate processing apparatus of claim 16, wherein the controller is further configured to:
derive in advance a correlation between a temperature of the electrostatic chuck and a holding time of the step (c); and
set, based on the correlation, the holding time of the step (c) from a target temperature of the electrostatic chuck when processing the substrate.

* * * * *